US008868896B2

(12) United States Patent
Fiandino

(10) Patent No.: US 8,868,896 B2
(45) Date of Patent: Oct. 21, 2014

(54) METHOD AND DEVICE FOR SIMULATING A RESET SIGNAL IN A SIMULATED SYSTEM ON CHIP

(75) Inventor: Maxime Fiandino, Argentine (FR)

(73) Assignee: STMicroelectronics (Grenoble 2) SAS, Grenoble (FR)

( * ) Notice: Subject to any disclaimer, the term of this patent is extended or adjusted under 35 U.S.C. 154(b) by 426 days.

(21) Appl. No.: 13/338,063

(22) Filed: Dec. 27, 2011

(65) Prior Publication Data

US 2012/0137115 A1    May 31, 2012

Related U.S. Application Data

(63) Continuation-in-part of application No. PCT/IB2010/001380, filed on Jun. 4, 2010.

(30) Foreign Application Priority Data

Jun. 30, 2009    (FR) ...................................... 0903179

(51) Int. Cl.
  *G06F 9/00*    (2006.01)
  *G06F 15/177*    (2006.01)
  *G06F 17/50*    (2006.01)
(52) U.S. Cl.
  CPC .................................. *G06F 17/5022* (2013.01)
  USPC ................................................. 713/2; 713/1
(58) Field of Classification Search
  USPC ......................................................... 713/1, 2
  See application file for complete search history.

(56) References Cited

U.S. PATENT DOCUMENTS

| 7,679,411 | B2 * | 3/2010 | Sakai et al. ................... 327/142 |
| 2004/0059903 | A1 * | 3/2004 | Smith et al. ....................... 713/1 |
| 2005/0138454 | A1 * | 6/2005 | Darmawaskita et al. ...... 713/323 |
| 2008/0307240 | A1 * | 12/2008 | Dahan et al. .................. 713/320 |
| 2009/0327686 | A1 * | 12/2009 | Kochar et al. ................. 713/100 |

OTHER PUBLICATIONS

Bhattacharya, B. et al., "Language Extensions to SystemC: Process Control Constructs," 44th ACM/IEEE Design and Automation Conference (DAC '07), San Diego, CA, pp. 35-38, Jun. 4-8, 2007.
Raabe, A. et al., "A SystemC Language Extension for High-Level Reconfiguration Modelling," Forum on Specification, Verification and Design Languages (FDL 2008), Stuttgart, Germany, pp. 55-60, Sep. 23-25, 2008.

* cited by examiner

*Primary Examiner* — Kim Huynh
*Assistant Examiner* — Zahid Choudhury
(74) *Attorney, Agent, or Firm* — Seed IP Law Group PLLC

(57) ABSTRACT

A method and system for simulating a reset signal in a modeled system comprises a reset control module and a module to be reset. Operations of the system include emitting by a control thread of the control module a reset signal, receiving by the module to be reset the reset signal, waking up a thread of the module to be reset, and waiting for a reset signal. If the thread is woken up by the reset signal further operations include activating a reset exception by the thread, and if a reset exception is raised, making the thread wait for a reboot signal, transmitting the reboot signal by the control thread to the module to be reset, and after receiving the reboot signal, activating the thread which executes and waits for a reset signal.

20 Claims, 3 Drawing Sheets

METHOD AND DEVICE FOR SIMULATING A RESET SIGNAL IN A SIMULATED SYSTEM ON CHIP

BACKGROUND

1. Technical Field

The present disclosure relates to the simulation of a system such as a System On Chip (SOC) comprising at least one processor and one or more peripheral units interconnected in network.

2. Description of the Related Art

Systems On Chip (SOC) increasingly tend to gather into a same integrated circuit hardware components such as heterogeneous processor cores, specialized circuits, and memories, as well as a complex communication architecture called "Network On Chip" (NOC), linking these components between them. A network on chip usually comprises several point-point data links linking the hardware components of the system on chip.

Due to the increasing complexity of systems on chip, it is desirable to implement design, modeling and simulation tools allowing a system to be tested at different designing steps, so as to be able to validate the system at each of these steps.

Generally, developing a complex system such as a system on chip starts with a step of defining specifications written in informal language. Then, there is a step of defining or selecting algorithms making it possible to match the specifications. The algorithms may be defined using a high level language like Matlab or C++. Defining the algorithms makes it possible to pass to a step of defining models of a first level of abstraction called "Transaction Level Model" TLM describing an architecture and therefore specifying a distribution between hardware and software (definition of the hardware components and software executed by the hardware components). The Transaction Level Model may gather functional models PV (Programmer View) and timed models PVT (Programmer View+Timing). A functional model makes it possible for example to simulate software embedded in a hardware component of the system. In a functional model, data transfers between the hardware components may be simulated by an ideal unique communication channel, i.e., having a not limited rate. Timed models make it possible to precociously evaluate a choice of architecture and distribution of threads between hardware and software. Time constraints to be respected by the hardware components of the system are induced by a choice of size of the words carried and rate of the communication channels. A Transaction Level Model may be defined using a language for modeling hardware systems such as SystemC, making it possible to represent hardware components by modules which are linked by ports connected to communication channels. The behaviors of hardware and software components are described by software modules written in a programming language such as C++ and executable by a simulator. SystemC is a hardware and software description language subject of the standard IEEE 1666-2005 developed by the Open SystemC Initiative (OSCI). The hardware and software components of a system may thus be modeled using SystemC, whatever the nature and abstraction level thereof.

A following development step comprises adding the clock concept to create a model with the precision of the BCA (Bus Cycle Accurate) cycle specifying the behavior of the system at each cycle of a clock clocking the system. Then there is a step for defining the Register Transfer Level (RTL) which then allows an integrated circuit to be rapidly and efficiently synthesized. The level RTL defines the value of each bit at each clock pulse using a language such as VHDL or Verilog. The level RTL then makes it possible to define logic gate networks which may be processed by placement and routing tools to obtain a two-dimension structure which serves as a base to make masks for the manufacture of an integrated circuit.

The abstraction levels TLM, BCA and RTL allow the performances of a system architecture to be thoroughly studied before implementing the system and embedding it into an integrated circuit.

However, existing simulation tools do not allow the propagation of a reset signal to be simulated in a system on chip simulated only at the abstraction level RTL. It is however desirable to be able to analyze the propagation and process of a reset signal in all or a part of a simulated system from the abstraction level TLM.

More precisely, a system is modeled at the abstraction level TLM, by imbricate components or modules and/or threads. The modules communicate between them by ports which may be interconnected by channels. A module may comprise one or more ports constituting input and/or output points of the module. A port is associated to one or more interfaces comprising of a function declaration (or method in the C++ terminology) which may be called by the module to which the port or other modules linked to the port by a channel belong. The channels are communication means between modules. They may model simple signals as well as more complex communication means and thus comprise other channels or even modules. The channels comprise the C++ code of the port interface functions. The modules may comprise methods, threads and other modules. The methods comprise functions which are executed at initializing the system or when an event occurs for example on one of the module ports. The threads describe a functionality of the system or a behavior and are activated exclusively by the simulator when particular events occur. The threads are launched once for example at initializing the system and comprise an endless loop with one or more instructions for waiting an event. If a thread ends, it does no longer execute. The simulator comprises a core performing in particular notifying events, and activating methods and threads.

Simulating a reset signal implies to be able to stop the threads and reset the methods and threads. Now a simulator such as SystemC only allows a whole system to be reset, i.e., a whole situation to be relaunched. It is therefore not possible to simulate a partial reset of a system. It is difficult either to test a part of the system at a more detailed abstraction level or software embedded into a component of the system during a reset because a reset completely stops a simulation.

It is therefore desirable to be able to simulate a partial reset signal and the thread thereof in a simulated system at least partially at the abstraction level TLM, without modifying the simulator core. It is also desirable to be able to reset some threads internal to modules. It is also desirable to be able to simulate several reset signals acting on different parts of a system.

BRIEF SUMMARY

An embodiment relates to a method for simulating a reset signal in a modeled system comprising a reset control module and a module to be reset, the method comprising emitting by a control thread of the control module a reset signal, and receiving by the module to be reset the reset signal. According to one embodiment, the method comprises: waking up a thread of the module to be reset, waiting for a reset signal, if the thread of the module to be reset is waken up by the reset signal, raising a reset exception by the thread of the module to be reset, and If a reset exception is raised, making the thread of the module to be reset wait for a reboot signal, emitting the reboot signal by the control thread, which is transmitted to the control module, and after the module to be reset receives the reboot signal, activating the thread of the module to be reset, which executes and waits for the reset signal.

According to one embodiment, the method comprises: declaring a method of the module to be reset, sensitive to the reset signal, after the module receives the reset signal, declaring the method to be reset sensitive to the reboot signal, and after the module receives the reboot signal, executing the method and declaring it sensitive to a reset signal.

According to one embodiment, the method comprises executing a function for initializing the module, after the module receives the reset signal.

According to one embodiment, each thread of the system is inserted into an endless loop comprising an instruction for waiting for the reset signal, followed by an instruction for raising a reset exception, an instruction for entering an exception processing procedure comprising an instruction for waiting for the reboot signal.

According to one embodiment, the method comprises replacing a wait instruction in a thread by a wait instruction, followed by an instruction for raising the reset exception executed if the reset signal has been received by the module to which the thread belongs.

According to one embodiment, the method comprises adding in an event list an instruction for defining an event list activating the execution of the method, an event of receiving the reset signal by the module to which the method belongs.

According to one embodiment, the method comprises emitting in the system a first reset signal for resetting a part of the system modules, and emitting in the system a second reset signal for resetting another part of the system modules.

According to one embodiment, the method comprises defining a reset signal emission port in the control module, defining a reset signal reception port of the module to be reset, and connecting the reset signal emission port to the reset signal reception port.

An embodiment also relates to a simulated system comprising a reset control module and a module to be reset, the control module comprising a thread configured to emit reset signals, the module to be reset comprising a thread to be reset after the module receives a reset signal. According to one embodiment, the system is configured to implement the method previously defined.

According to one embodiment, the module to be reset comprises a method to be reset declared sensitive to the reset signal, declared sensitive to the reboot signal after receiving the reset signal, and executed and declared sensitive to the reset signal after receiving the reboot signal.

According to one embodiment, the module comprises an initialization function executed after the module receives the reset signal.

According to one embodiment, the control module comprises a reset signal emission port, and the module to be reset comprises a reset signal reception port connected to the emission port of the control module.

The disclosure also relates to a computer readable medium having computer executable instructions thereon for performing various operations implementing the methods and processes described herein.

BRIEF DESCRIPTION OF THE SEVERAL VIEWS OF THE DRAWINGS

Embodiments of the disclosure will be described hereinafter, in relation with, but not limited to the appended figures wherein.

DETAILED DESCRIPTION

Figure 1:
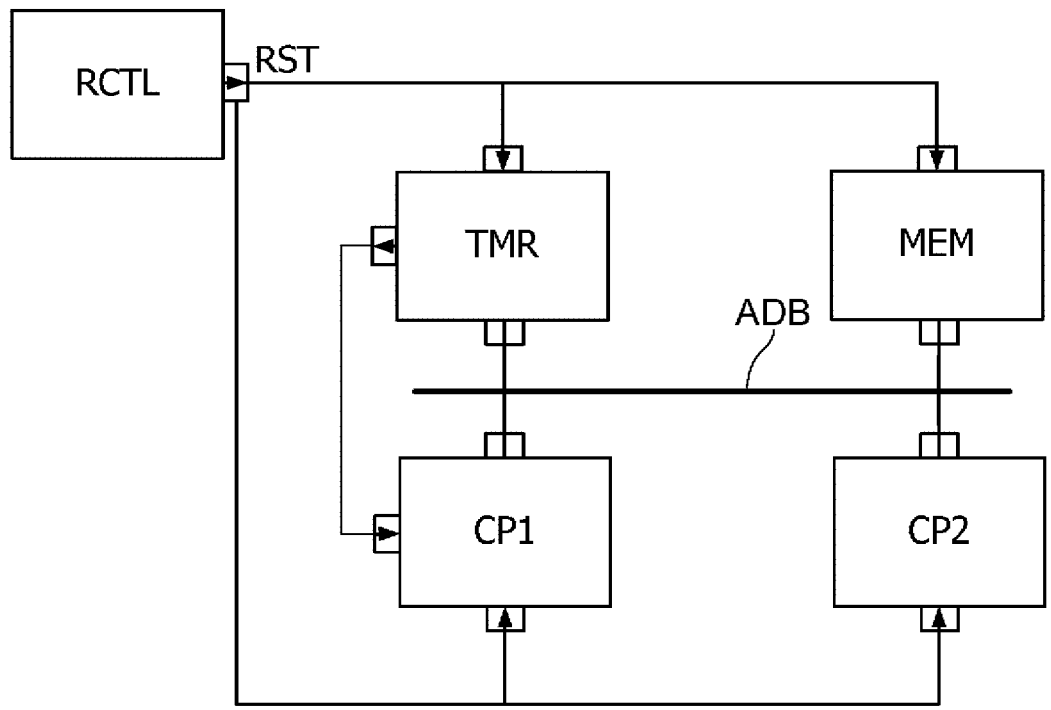
FIG. 1 schematically shows an example of a system which may be reset.

FIG. 1 shows a system simulated at the abstraction level TLM (Transaction Level Model) comprising several modules TMR, MEM, CP1, CP2 linked between them by a bus ADB. The modules TMR and MEM simulate for example a counter and a memory. The modules CP1 and CP2 simulate for example a processor and a generator. The module TMR is linked to the module CP1 by an interrupt link.

According to one embodiment, the system comprises a module for controlling a reset signal RCTL simulating a reset signal management circuit. The module RCTL comprises a reset signal emission port RST connected to a port for initializing modules to be reset TMR, MEM, CP1, CP2.

Figure 2:
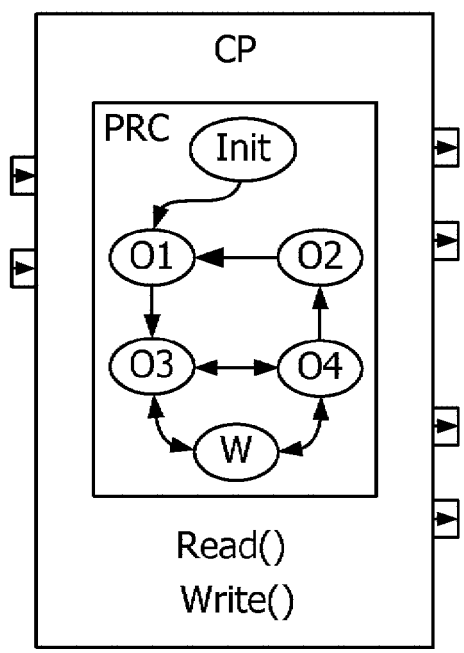
FIG. 2 schematically shows an example of system module for simulating a reset signal in a simulated system on chip.

FIG. 2 shows an example of module CP comprising several input and/or output ports and a thread PRC. The thread PRC comprises several operations among which an initialization operation Init, and operations O1-O4, W which are executed after the operation Init. The operations O1-O4, W form between them an endless loop comprising a wait instruction W for triggering by the simulator. The instruction W may specify one or more events which reactivate the thread.

Figure 3:
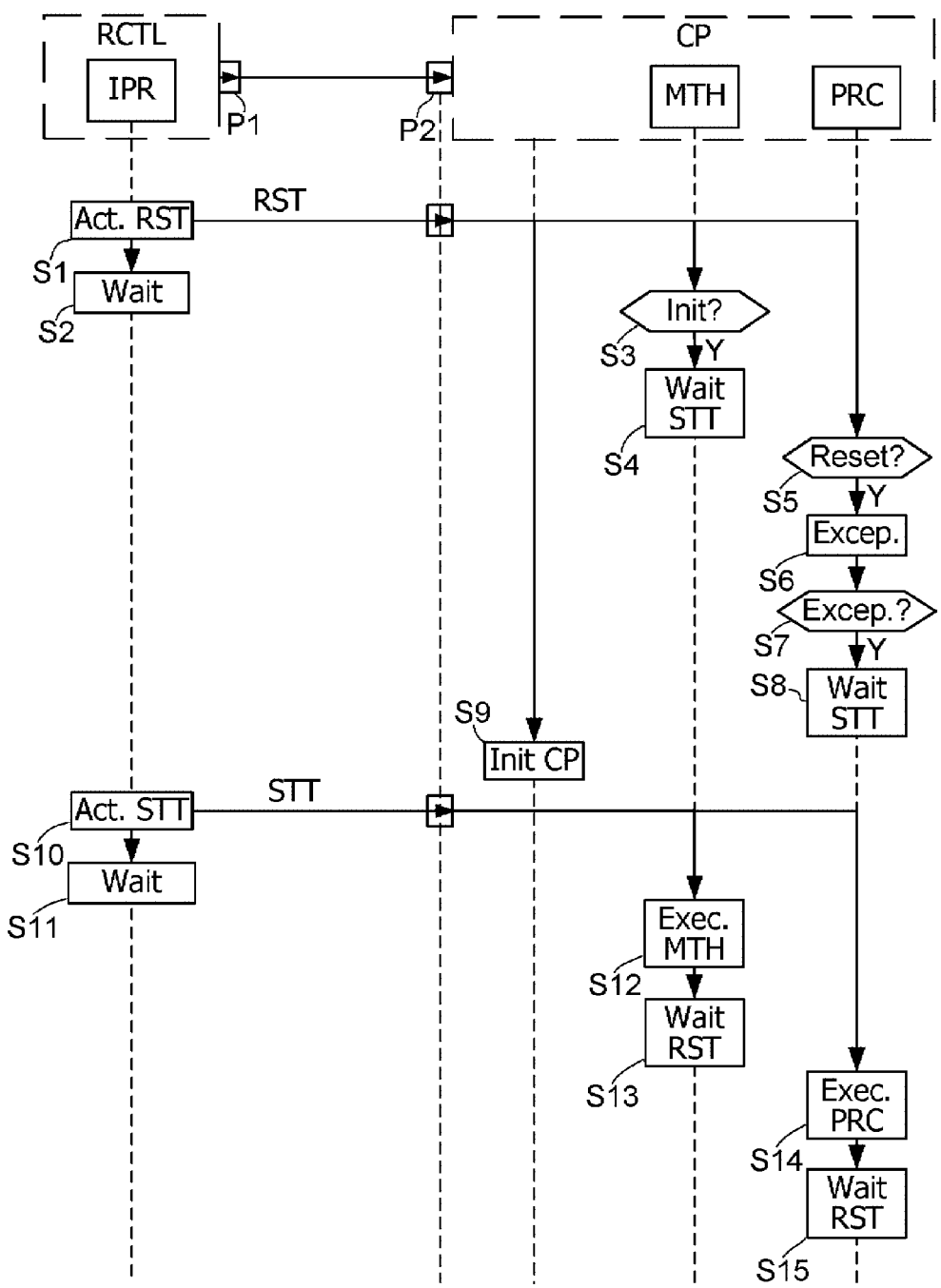
FIG. 3 is a timing diagram showing operations triggered in a system after the emission of a reset signal.

FIG. 3 shows steps of propagating and processing a reset signal, in a system comprising two modules CP and RCTL, among which a reset signal control module RCTL. The module RCTL comprises a thread IPR which is activated at launching a system simulation. The module CP comprises a method MTH and a thread which are configured to be launched at initializing the module CP. The module RCTL comprises a reset signal emission port P1 and the module CP comprises a port P2 for receiving the reset signal.

Upon reception by the module RCTL of a reset order, the thread IPR executes steps S1, S2. At step S1, the thread IPR sends a reset signal RST to the reset port of the module CP. At step S2, the thread IPR waits for a period sufficient to allow initialization processes to be executed by the modules to be reset of the system. The reception by the module CP of the signal RST triggers processes in the threads and methods of the module CP, to be executed at the system initialization.

Upon reception of the signal RST by the module CP, the simulator core executes the methods of the module sensitive to this event, wakes up the threads waiting for this event, and executes the reset functions of the module.

The method MTH executes steps S2 and S3. At step S2, if the method MTH is to be activated upon initialization of the module CP, the method MTH declares itself activable only by a reboot event STT of the module CP (step S4). In addition, the thread PRC is waken up upon reception by the module CP of the signal RST and executes steps S5 to S8. At steps S5 and S6, if the event received is a reset event RST, the thread PRC raises an exception linked to the event RST. Steps S7 and S8 are executed if an exception is raised. At step S7, the thread PRC tests the nature of the exception. At step S8, the thread PRC waits for a reboot event STT if the exception raised is linked to the event RST. At step S9 triggered at the end of reset processes, the module CP executes a function of initializing local variables of the module.

At step S10, the initialization thread IPR of the module RCTL stops waiting and executes steps S10 and S11. At step S10, the thread IPR sends a reboot event STT of the system. This event is transmitted to the reset port of the module CP. The reception of this event activates the method MTH which executes at step S12. At step S13, the method MTH declares itself sensitive to the reset event RST. The reception of the event STT also wakes up the thread PRC which executes at step S14 until reaching an instruction for waiting a new event RST at step S15.

Raising an exception makes it possible to automatically go up in the stack of successive calls of functions in the model, which allows the threads to be reset.

In an embodiment, steps S1 to S15 previously described may be implemented with a SystemC simulator as follows.

The module CP of a system is conventionally defined as detailed in Annex 1. Annex 1 describes a way of coding the module CP simulated with SystemC. The module CP is defined as a structural block inside which threads and methods in particular are instantiated. The module CP may comprise input and/or output ports to communicate with the exterior, threads, methods, variables and a constructor. The module constructor allows the initializations which the module is to perform. The module CP also comprises a part of instantiation of the module elements, and in particular the methods and threads. Thus, in the example of Annex 1, the module CP comprises the method MTH and the thread PRC. The instantiation of a method or a thread is performed by a declaration and a record of the method or thread. Activating a method or a thread is performed by a scheduler of the SystemC core. A default sensitivity list is allocated to each method and thread, defining the events activating the method or thread. In the example of Annex 1, the sensitivity list of the method MTH comprises an event ev1. The instantiation of a method or a thread also comprises the processes performed by the method "void CP::MTH( )" and the thread "void CP::PRC( )" in the form of a sequence of instructions. A thread generally comprises an endless loop including one or more instructions for waiting an event (instruction wait), so that once the thread is launched by the core, it stops only at these wait instructions. A method is launched by the core at the arrival of an event belonging to the sensitivity list of the method. The function next_trigger( ) makes it possible either to modify the sensitivity list of the method when a new event list has passed in parameter of the function, or to take the event list declared when the function is called without parameter.

To be able to process a reset order, the module CP is modified as detailed in Annex 2. In Annex 2, the code of the module CP is modified to include the inclusion of a specific management library of a reset signal RST. The module CP also comprises an inheritance instruction on a class of management of the reset signal "public dvk_tlm_reset::tlm_reset". The code of the module CP also comprises adding the declaration of a port "reset" of reception of signals RST and STT, and in the declarations of the methods and threads of the module, the declaration of a thread to be launched during the appearance of the signal RST TLM_RESET_SC_THREAD_IMPLEMENT(PRC) for each thread PRC of the module. The module CP also comprises a function reset_initialize( ) for resetting variables of the module, to be called at the end of the process of the signal RST. In its constructor part, the module CP comprises an instruction for constructing a management class of the reset signal with the "reset" port in parameter "dvk_tlm_reset::tlm_reset(reset)", an instruction for constructing the "reset" port "reset("reset")", and an instruction for connecting the port "reset" "reset(*this)". The instantiation part of the methods and threads also comprise adding the sensitivity of the method to the event RST and a modified macroinstruction of declaration of the thread PRC "TLM_RESET_SC_THREAD(PRC)" with the thread name as parameter. In the process of the thread PRC, the instruction wait( ) is replaced by an instruction tlm_wait( ). The process of the method MTH is also modified by adding the call to a function tlm_reset_sc_method_start(bool) with a true or false Boolean as parameter whether the method is initialized at each reception of the signal RST or not. The possible calls to the function next_trigger( ) of the method MTH are replaced by the call to a function tlm_next_trigger( ).

The thread TLM_RESET_SC_THREAD_IMPLEMENT (PRC) inserts into an endless loop the process of the thread PRC, followed by a call to the function TLM_wait(RST). The function TLM_wait(RST) calls the function wait(RST) to wait for the event RST, and then raises a reset exception if a reset procedure has been activated (instruction throw). The call of the function TLM_wait(RST) in the thread TLM_RESET_SC_THREAD_IMPLEMENT(PRC) is followed by an instruction for processing the reset exception (instruction catch) which is executed as soon as an exception has been raised and which triggers the execution of a reset process sequence if the raised exception is linked to the reset event RST. The reset process sequence counts the number of reset threads and if all the threads of the module have been reset, the reset process of the module is considered as achieved. The reset process sequence ends by a call to the function wait (STT) to wait for the boot event STT. The provision of the thread TLM_RESET_SC_THREAD_IMPLEMENT including each thread of the module makes it possible to avoid a thread having achieved its process by coming out of its internal endless loop from being activated again upon reception by the module CP of a reset signal. The provision of an exception raising after detecting the apparition of the signal RST allows the reset process of a thread to be centralized whatever the location in the thread process of the instruction for waiting the signal RST.

The function tlm_reset_sc_method_start(bool) called by the method MTH tests if the event RST is being processed and whether the method is to be initialized. If this is the case, the event STT is placed in the sensitivity list of the method by a call to the function next_trigger( ). The result is that upon reception of the event STT by the module CP, the thread PRC is reactivated at its boot point and the method MTH is executed if needed at the launching of the simulation.

The modifications brought to the module, indicated in Annex 2 are made in the modules, threads and methods which are to be reset, after the module RCTL emits the event RST. Thus, it is possible to simulate the propagation and process of a reset signal in a system modeled at the transaction level TLM without having to modify the simulator core.

Figure 4:
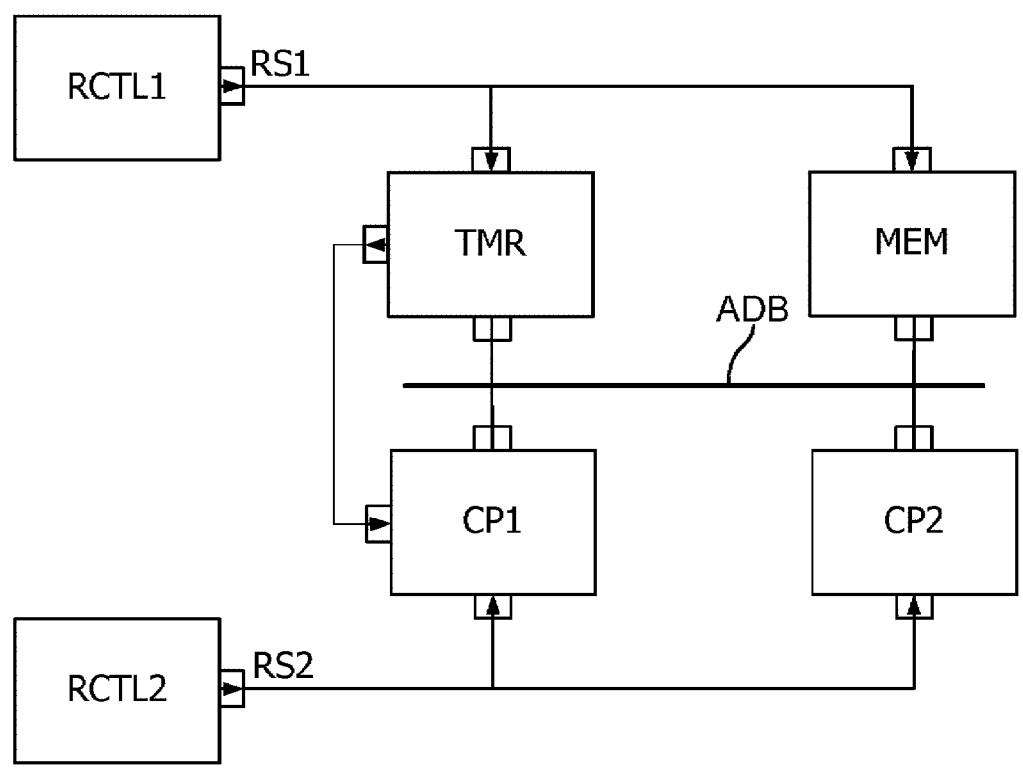
FIG. 4 schematically shows another example of a system which may be partially reset.

Several reset signal paths may also be defined in a system, by defining several reset signals emitted by one or more reset control modules, and by connecting reset signal emission ports to ports for receiving such signals provided on the modules to be reset. Thus, FIG. 4 shows a system which differs from the system shown in FIG. 2 in that it comprises two reset control modules RCTL1 and RCTL2, each module RCTL1 and RCTL2 comprising a reset signal emission port. The reset signal emission port of the module RCTL1 is connected to the modules TMR and MEM and emits a reset signal RS1. The reset signal emission port of the module RCTL2 is connected to the modules CP1 and CP2 and emits a reset signal RS2.

Annex 3 shows an embodiment of the thread modified by the macroinstruction TLM_RESET_SC_THREAD_IMPLEMENT. The macroinstruction TLM_RESET_SC_THREAD_IMPLEMENT receives the name of the module thread as parameter, PRC in the example of FIG. 3. The macroinstruction creates a new function which name is that of the thread passed in parameter of the macroinstruction, preceded by "tlm_reset_", that is tlm_reset_PRC in the example of FIG. 3.

The thread created by the macroinstruction _RESET_THREAD_IMPLEMENT begins by an instruction of endless loop "do" which works with the instruction "while (1)" at the end of the thread defining the end of the endless loop. The thread then comprises an instruction "try" defining a sequence of instructions sensitive to the raise of an exception. This sequence of instructions comprises an instruction for calling "name( )" the thread which name "name" is passed in parameter of the thread TLM_RESET_SC_THREAD_IMPLEMENT, an instruction for waiting the event RST "wait (RST)", and an instruction for testing the presence of a reset process in progress. In the example of FIG. 3, "name" is PRC. If a reset process is in progress, an instruction for raising an exception "throw" is executed to raise the reset exception "reset_exception". The thread TLM_RESET_SC_THREAD_IMPLEMENT then comprises an instruction "catch" introducing a sequence of instructions executed if an exception is raised. This sequence of instructions comprises an instruction for waiting the reboot signal STT. In accordance with the principle of the operation of an exception, the instruction "catch" is executed as soon as the exception is raised and whatever the position in the code of the thread TLM_RESET_SC_THREAD_IMPLEMENT of the instruction for raising exception "throw". In other words, the thread "name" is thus placed in an endless loop in which it is called and waits for the reset signal RST. At the end of the waiting period, if the initialization signal has appeared, the reset exception is raised. In the sequence for processing the reset exception, the thread waits for the reboot signal STT. A new iteration of the endless loop is then executed.

It will appear clearly to those skilled in the art that the present disclosure is susceptible of various embodiments. Thus the disclosure is not limited to the use of SystemC. In fact, the disclosure may be implemented with other simulators, and in a system modeled at various other abstraction levels.

The various embodiments described herein can be combined to provide further embodiments. Aspects of the embodiments can be modified, if so desired to employ concepts of the various patents, application and publications to provide yet further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

---

Annex 1

```
// Including the library of SystemC
#include "systemc.h"
SC_MODULE(CP) {
  // declaring the ports, signals, variables of the module
  ...
  unsigned int my_variable;
  ...
  // constructor   (to perform the initializations
                   for the module)
     my_module(sc_module_name CP) : sc_module(CP)
     {
       my_variable(0x1234)      // Commissioning value of the
                                // variable
       ...
     }
  // declaring the methods and threads of the module
  void MTH( );
  void PRC( );
  // Instantiation of methods and threads in the module
  SC_HAS_PROCESS(CP);
     //List of methods and threads of the module:
     // Recording the thread as a SC_METHOD
     SC_METHOD(MTH);
     // Declaring its sensitivity list or list     of events
  reactivating the execution of the method
     sensitive << ev1;
     // Recording the thread PRC
     SC_THREAD(PRC);
     ...
     }
};
void CP::PRC( ) {
  // Endless loop with wait instruction:
  while (true) {
     ... // processes of the thread
     wait( );
  }
}
void CP::MTH( ) {
  ... // processes of the method
  next_trigger( );
  ... // other processes of the method
}
```

---

Annex 2

```
// Inclusion of the library of SystemC
#include "systemc.h"
// Inclusion of the management library of a reset     signal
RST
#include "tlm_reset.h"
SC_MODULE(CP)
  // Adding the inheritance on a management class of the
  // signal RST
  public dvk_tlm_reset::tlm_reset
{
  // declaring the ports, signals, variables
  unsigned int my_variable;
  // Adding the declaration of the connection port for
  //   receiving the signals RST and STT
  dvk_tlm_reset::tlm_reset_target_port reset;
  ...
  // declaring the methods and threads of the module
  void MTH( );
  //Declaring the thread PRC as thread to be
  //   reset during the process of a reset
  //   order
  TLM_RESET_SC_THREAD_IMPLEMENT(PRC);
  void PRC( );
  //Adding a function for initializing variables
  //    during a reset, automatically
  //    called at the end of reset
```

Annex 2

```
virtual void reset_initialize( )
    {
    my_variable = 0x1234;   // Initial value of the
                            // variable
    }
// constructor   (to perform the initializations
                 for the module)
my_module(sc_module_name CP) : sc_module(CP)
    // Constructing the management class of the reset
    // signal with the reception port of the signal
    // RST in parameter:
    dvk_tlm_reset::tlm_reset(reset),
    // Constructing the reset port
    reset("reset"),
    {
    my_variable(0x1234)     // Initial value of the
                            // variable
    // Connecting to the reset port
    reset(*this);
    ...
    }
// Instantiation of methods and threads in the module
SC_HAS_PROCESS(CP);
    //List of methods and threads of the module:
    // Recording the thread as a SC_METHOD
    SC_METHOD(MTH);
    // Declaring its sensitivity list:
    // adding the method sensitivity to the reset
    // event:
    sensitive << ev1 << dvk_tlm_reset::tlm_reset::reset_event;
    // Recording the thread PRC
    TLM_RESET_SC_THREAD(PRC);
    // the declaration Macro of the thread is modified
    ...
    }
};
void CP::PRC( ) {
while (true) {
    ... // processes of the thread
    TLM_wait( );
    // the call of the wait function wait( ) has been
    // replaced by the call of the function TLM_wait( )
    }
}
void CP::MTH( ) {
    // the processes of the method begin by a call of
    // reset management function with
    // in parameter "true" if the method is to be activated at
    // each reset or "false":
    tlm_reset_sc_method_start(false);
    ... // processes of the method
    TLM_next_trigger( );
    // the call to the function next_trigger( ) has been replaced
    //by a call to a function TLM_next_trigger( )
    ... // other processes of the method
}
```

Annex 3

```
#define TLM_RESET_SC_THREAD_IMPLEMENT(name)
void tlm_reset_##name( ) {
do
    {
    try
        {
        name( );
        wait(RST);
        if (in_reset) throw reset_exception( );
        }
    catch(reset_exception &e)
        {
        wait(STT);
        }
    }
```

Annex 3

```
while(1);
}
```

The invention claimed is:

1. A method comprising:
emitting a reset signal by a control thread of a control module;
transmitting the reset signal to a module to be reset;
waking up a thread of the module to be reset, which is waiting for the reset signal;
if the thread of the module to be reset is woken up by the reset signal, raising a reset exception by the thread of the module to be reset;
if the reset exception is raised, causing the thread of the module to be reset to wait for a reboot signal;
emitting the reboot signal by the control thread;
transmitting the reboot signal to the control module, and
after the module to be reset receives the reboot signal, activating the thread of the module to be reset, which executes and waits for the reset signal.

2. A method according to claim 1, further comprising:
declaring a method of the module to be reset sensitive to the reset signal;
after the module to be reset receives the reset signal, declaring the method sensitive to the reboot signal, and
after the module to be reset receives the reboot signal, executing the method and declaring the method sensitive to a reset signal.

3. A method according to claim 1 further comprising executing a function for initializing the module to be reset, after the module to be reset receives the reset signal.

4. A method according to claim 1 further comprising the control thread of the control module and the thread of the module to be reset entering an endless loop comprising an instruction for waiting for the reset signal, followed by an instruction for raising a reset exception, and an instruction for entering an exception processing procedure comprising an instruction for waiting for the reboot signal.

5. A method according to claim 1, further comprising providing a wait instruction in a thread followed by an instruction for raising the reset exception, the reset exception to be executed if the reset signal has been received by a module to which the thread belongs.

6. A method according to claim 1, further comprising providing in an event list an instruction for defining activation of execution of a method of a module upon an event of receiving the reset signal by the module.

7. A method according to claim 1, further comprising:
emitting a first reset signal for resetting one or more system modules; and
emitting a second reset signal for resetting one or more other system modules.

8. A method according to claim 1, further comprising:
defining a reset signal emission port of the control module;
defining a reset signal reception port of the module to be reset; and
connecting the reset signal emission port to the reset signal reception port.

9. A system comprising:
a reset control module; and
a module to be reset in operable communication with the reset control module, the reset control module comprising a thread configured to emit reset signals, the module to be reset comprising a thread to be reset after the module to be reset receives a reset signal, wherein the reset control module and module to be reset are configured to:
- wake up the thread to be reset by the reset signal of the reset control module;
- if the thread to be reset is woken up by the reset signal, raise a reset exception by the thread to be reset;
- if a reset exception is raised, cause the thread to be reset to wait for a reboot signal;
- emit the reboot signal by a control thread of the reset control module, which is transmitted to the reset control module; and
- after the module to be reset receives the reboot signal, activate the thread to be reset, which executes and waits for the reset signal.

10. A system according to claim 9, wherein the module to be reset comprises a method to be reset declared sensitive to the reset signal, wherein said method to be reset is configured to be declared sensitive to the reboot signal after receiving the reset signal, and configured to be executed and declared sensitive to the reset signal after receiving the reboot signal.

11. A system according to claim 9, wherein the module to be reset comprises an initialization function configured to be executed after the module to be reset receives the reset signal.

12. A system according to claim 9 wherein the reset control module comprises a reset signal emission port, and the module to be reset comprises a reset signal reception port connected to the reset signal emission port of the control module.

13. A non-transitory computer readable medium having executable instructions thereon for performing a method comprising:
- emitting a reset signal by a control thread of a control module;
- transmitting the reset signal to a module to be reset;
- waking up a thread of the module to be reset, which is waiting for the reset signal;
- if the thread of the module to be reset is woken up by the reset signal, raising a reset exception by the thread of the module to be reset;
- if the reset exception is raised, causing the thread of the module to be reset to wait for a reboot signal;
- emitting the reboot signal by the control thread;
- transmitting the reboot signal to the control module; and
- after the module to be reset receives the reboot signal, activating the thread of the module to be reset, which executes and waits for the reset signal.

14. A computer readable medium according to claim 13, further comprising instructions thereon for:
- declaring a method of the module to be reset sensitive to the reset signal;
- after the module to be reset receives the reset signal, declaring the method to be sensitive to the reboot signal, and
- after the module to be reset receives the reboot signal, executing the method and declaring the method sensitive to a reset signal.

15. A computer readable medium according to claim 13, further comprising instructions thereon for executing a function for initializing the module to be reset, after the module to be reset receives the reset signal.

16. A computer readable medium according to claim 13, further comprising instructions thereon for the control thread of the control module and the thread of the module to be reset entering an endless loop comprising an instruction for waiting for the reset signal, followed by an instruction for raising a reset exception, and an instruction for entering an exception processing procedure comprising an instruction for waiting for the reboot signal.

17. A computer readable medium according to claim 13, further comprising instructions thereon for providing a wait instruction in a thread followed by an instruction for raising the reset exception, the reset exception to be executed if the reset signal has been received by a module to which the thread belongs.

18. A computer readable medium according to claim 13, further comprising instructions thereon for providing in an event list an instruction for defining activation of execution of a method of a module upon an event of receiving the reset signal by the module.

19. A computer readable medium according to claim 13, further comprising instructions thereon for:
- emitting a first reset signal for resetting one or more system modules; and
- emitting a second reset signal for resetting one or more other system modules.

20. A computer readable medium according to claim 13, further comprising instructions thereon for:
- defining a reset signal emission port in the control module;
- defining a reset signal reception port of the module to be reset; and
- connecting the reset signal emission port to the reset signal reception port.

* * * * *